(12) United States Patent
Chang et al.

(10) Patent No.: US 8,169,002 B2
(45) Date of Patent: May 1, 2012

(54) HIGH ELECTRON MOBILITY TRANSISTOR AND METHOD FOR FABRICATING THE SAME

(75) Inventors: Edward Yi Chang, Hsinchu (TW);
Chien-I Kuo, Hsinchu (TW);
Heng-Tung Hsu, Jhongli (TW)

(73) Assignee: National Chiao Tung University, Hsinchu (TW)

( * ) Notice: Subject to any disclaimer, the term of this patent is extended or adjusted under 35 U.S.C. 154(b) by 263 days.

(21) Appl. No.: 12/759,012

(22) Filed: Apr. 13, 2010

(65) Prior Publication Data
US 2011/0156100 A1    Jun. 30, 2011

(30) Foreign Application Priority Data
Dec. 31, 2009    (TW) .............................. 98146534 A

(51) Int. Cl.
*H01L 29/66*   (2006.01)
*H01L 21/338*  (2006.01)
(52) U.S. Cl. ................ 257/192; 257/194; 257/E29.246; 257/E29.249; 438/172
(58) Field of Classification Search .................. 257/190, 257/192, 194, E29.246, E29.249; 438/167, 438/172
See application file for complete search history.

(56) References Cited

U.S. PATENT DOCUMENTS

| 4,797,716 A | 1/1989 | Chaffin et al. |
| 4,894,691 A | 1/1990 | Matsui |
| 5,258,632 A * | 11/1993 | Sawada .......................... 257/194 |

OTHER PUBLICATIONS

Onda, K., et al.; "0.2um T-Shaped Gate 2DEGFET's with an (InAs)(GaAs) Short Period Superlattice Channel on a GaAs Substrate;" IEEE; 1990' pp. 19.21-19.24.
Nishiyama, N., et al.; "n-AlInAs/(InAs)3(GaAs)1 Superlattice Modulation-Doped Field Effect Transistor Grown by Molecular Beam Epitaxy;" Electronics Letters; vol. 26, No. 13; Jun. 21, 1990; pp. 885-886.
Auer, U., et al.; "InP-Based Heterostructure Field-Effect Transistors with High-Quality Short-Period (InAs)3m/(GaAs) 1m Superlattice Channel Layers;" Journal of Crystal Growth; 1995; pp. 1225-1229.

* cited by examiner

*Primary Examiner* — Minh-Loan T Tran
(74) *Attorney, Agent, or Firm* — Thomas, Kayden, Horstemeyer & Risley, LLP

(57) ABSTRACT

A high electron mobility transistor includes a substrate, a buffer layer, a channel layer, a spacer layer, a schottky layer and a cap layer. The buffer layer is formed on the substrate. The channel layer is formed on the buffer layer, in which the channel layer comprises a superlattice structure formed with a plurality of indium gallium arsenide thin films alternately stacked with a plurality of indium arsenide thin films. The spacer layer is formed on the channel layer. The schottky layer is formed on the spacer layer. The cap layer is formed on the schottky layer.

20 Claims, 7 Drawing Sheets

HIGH ELECTRON MOBILITY TRANSISTOR AND METHOD FOR FABRICATING THE SAME

RELATED APPLICATIONS

This application claims priority to Taiwan Patent Application Serial Number 98146534, filed Dec. 31, 2009, which is herein incorporated by reference.

BACKGROUND

1. Technical Field

The present disclosure relates to a high-frequency device. More particularly, the present disclosure relates to a high electron mobility transistor with a superlattice structure.

2. Description of Related Art

For a high electron mobility transistor (HEMT) as a high-frequency device, when a channel layer therein is grown by epitaxy and has a superlattice structure, the composition of the superlattice structure is usually complex and thus difficult to be grown by epitaxy. On the contrary, if purer indium gallium arsenide (InGaAs) is used, for the HEMT having a hetero-structure, the indium (In) content therein may not be high enough so that in the HEMT the electron effective mass is not small enough and the electron mobility is inclined to be low. As a result, the direct-current characteristics and high-frequency characteristics of the HEMT are not better.

On the other hand, the device characteristics mentioned above are closely related to the gate length of the device. However, if the nanometer-scaled gate length is fabricated in order to improve the device characteristics, the electron-beam lithography system has to be used. Thus, the production cannot be raised and the production costs could increase.

SUMMARY

In accordance with one embodiment of the present invention, a high electron mobility transistor is provided. The high electron mobility transistor includes a substrate, a buffer layer, a channel layer, a spacer layer, a schottky layer and a cap layer. The buffer layer is formed on the substrate. The channel layer is formed on the buffer layer, in which the channel layer comprises a superlattice structure formed with a plurality of indium gallium arsenide thin films alternately stacked with a plurality of indium arsenide thin films. The spacer layer is formed on the channel layer. The schottky layer is formed on the spacer layer. The cap layer is formed on the schottky layer.

In accordance with another embodiment of the present invention, a method for fabricating a high electron mobility transistor is provided. The method includes the steps as follows. A metamorphic buffer layer is formed on a substrate. A growth buffer layer is formed on the metamorphic buffer layer. a plurality of indium gallium arsenide thin films are alternately stacked with a plurality of indium arsenide thin films on the growth buffer layer, in which the indium gallium arsenide thin films alternately stacked with the indium arsenide thin films are formed as a channel layer. A spacer layer is formed on the channel layer. A delta-doped thin film is formed on the spacer layer. A schottky layer is formed on the delta-doped thin film. A cap layer is formed on the schottky layer.

In accordance with yet another embodiment of the present invention, a high electron mobility transistor is provided. The high electron mobility transistor includes a gallium arsenide substrate, an InAlAs metamorphic buffer layer, an $In_{0.52}Al_{0.48}As$ growth buffer layer, a plurality of $In_xGa_{1-x}As$ thin films, a plurality of InAs thin films, an $In_{0.52}Al_{0.48}As$ spacer layer, an $In_{0.52}Al_{0.48}As$ schottky layer and an $In_{0.53}Ga_{0.47}As$ cap layer. The InAlAs metamorphic buffer layer is formed on the gallium arsenide substrate. The $In_{0.52}Al_{0.48}As$ growth buffer layer is formed on the InAlAs metamorphic buffer layer. The $In_xGa_{1-x}As$ thin films and the InAs thin films are alternately stacked with each other on the $In_{0.52}Al_{0.48}As$ growth buffer layer, in which X has a range of 0.53-0.8, and the $In_xGa_{1-x}As$ thin films alternately stacked with the InAs thin films have a total thickness of approximately 14-16 nm. The $In_{0.52}Al_{0.48}As$ spacer layer is formed on the $In_xGa_{1-x}As$ thin films alternately stacked with the InAs thin films. The $In_{0.52}Al_{0.48}As$ schottky layer is formed on the $In_{0.52}Al_{0.48}As$ spacer layer. The $In_{0.53}Ga_{0.47}As$ cap layer is formed on the $In_{0.52}Al_{0.48}As$ schottky layer.

For the foregoing embodiments, the high electron mobility transistor and the method for fabricating the same can be applied not only to improve the high-frequency characteristics of the transistor (e.g. high current gain cut-off frequency, low noise figure), but also to be helpful for freeing the nanometer-scaled gate length of the high electron mobility transistor from having to be fabricated with an electron-beam lithography system when persons skilled in the art develop the transistor with high efficacy, such that the gate electrode can be defined by the optical lithography stepper so as to raise the yield rate.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiments, with reference to the accompanying drawings as follows.

DESCRIPTION OF THE EMBODIMENTS

In the following description, several specific details are presented to provide a thorough understanding of the embodiments of the present invention. One skilled in the relevant art will recognize, however, that the present invention can be practiced without one or more of the specific details, or in combination with or with other components, etc. In other instances, well-known implementations or operations are not shown or described in detail to avoid obscuring aspects of various embodiments of the present invention.

The terms used in this specification generally have their ordinary meanings in the art and in the specific context where each term is used. The use of examples anywhere in this specification, including examples of any terms discussed herein, is illustrative only, and in no way limits the scope and meaning of the invention or of any exemplified term. Likewise, the present invention is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
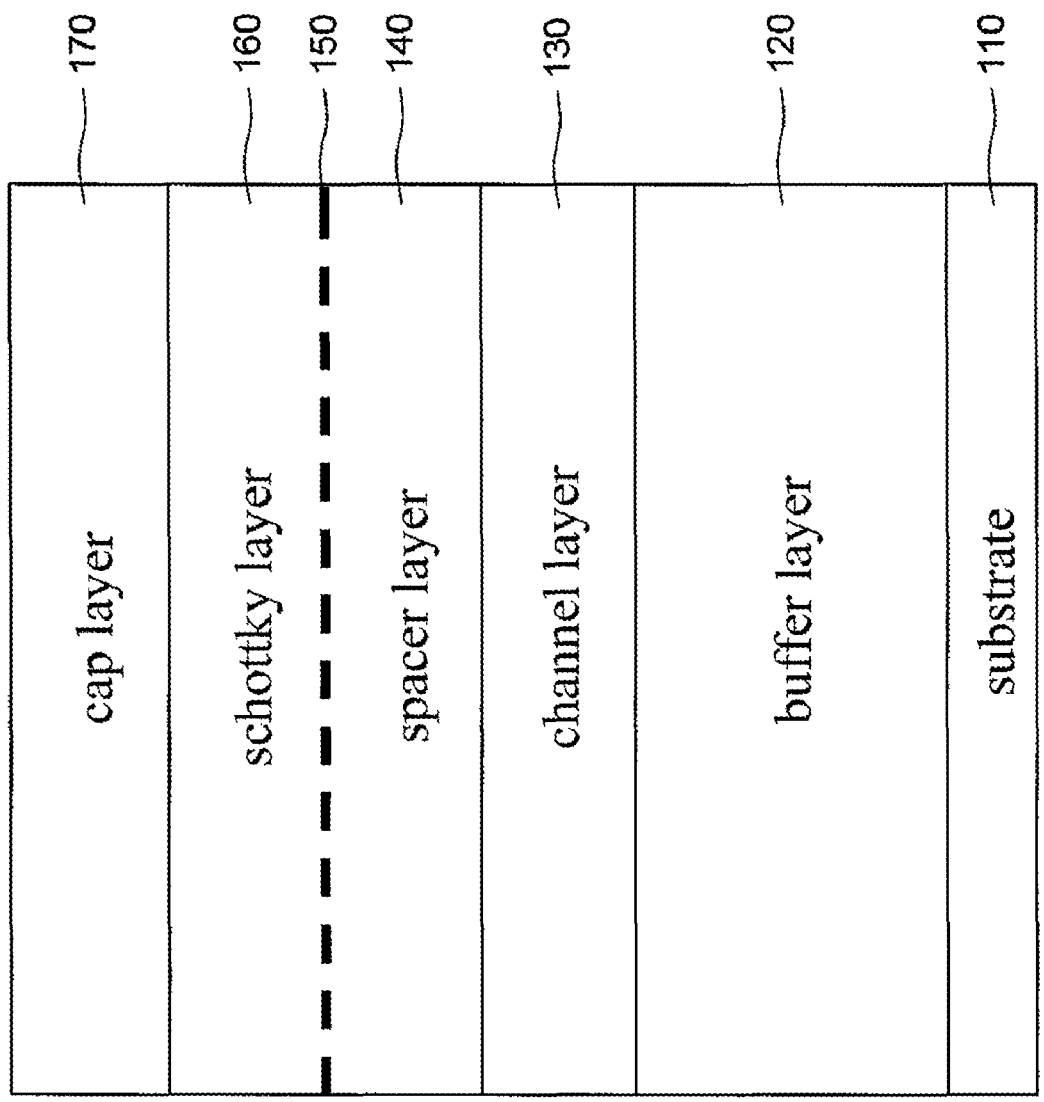
FIG. 1 is a summary diagram of a structure of a high electron mobility transistor (HEMT) according to one embodiment of the present invention.

FIG. 1 is a summary diagram of a structure of a high electron mobility transistor (HEMT) according to one embodiment of the present invention. As shown in the figure, the HEMT structure 100 includes a substrate 110, a buffer layer 120, a channel layer 130, a spacer layer 140, a delta-doped thin film 150, a schottky layer 160 and a cap layer 170.

The buffer layer 120 is formed on the substrate 110 and used as a transition layer so that the channel layer 130 can be formed subsequently. Specifically, the channel layer 130 can further include a metamorphic buffer layer and a growth buffer layer (shown in FIG. 2), in which the metamorphic buffer layer is first formed on the substrate 110 and the material of the metamorphic buffer layer is different from that of the substrate 110, such that the stress could thus be produced in the metamorphic buffer layer to result in that the lattice structure of the metamorphic buffer layer may have dislocations or defects. Then, the growth buffer layer is formed on the metamorphic buffer layer until the metamorphic buffer layer is grown to have a certain thickness. The material of the growth buffer layer is the same as that of the metamorphic buffer layer, so the lattice structure of the growth buffer layer is more complete and has less dislocations or defects. As a result, the basis for subsequently forming the channel layer 130 is made.

The channel layer 130 is formed on the buffer layer 120 and includes a superlattice structure (shown in FIG. 2), in which the superlattice structure is formed with a plurality of indium gallium arsenide ($In_XGa_{1-X}As$) thin films alternately stacked with a plurality of indium arsenide (InAs) thin films, and X has a range of approximately 0.53-0.8. In one embodiment, the thickness of the foregoing superlattice structure is approximately 10-20 nm. In another embodiment, the thickness of the foregoing superlattice structure is approximately 12-18 nm.

The spacer layer 140 is formed on the channel layer 130 so as to confine the electrons in the channel layer 130 when the device operates. The delta-doped thin film 150 is a single delta-doped sheet layer and formed on the spacer layer 140, so as to provide sufficient carriers (or electrons) for the channel layer 130 when the device operates. In one embodiment, the delta-doped thin film 150 includes silicon (Si) with a doping concentration of approximately $3\text{-}5\times10^{12}$ cm$^{-3}$.

The schottky layer 160 is formed on the delta-doped thin film 150. The cap layer 170 is formed on the schottky layer 160. After that, the metal gate, drain and source electrode can be fabricated on the HEMT structure 100, the gate electrode can make schottky contact with the schottky layer 160, and the cap layer 170 can reduce the ohmic contact. In one embodiment, the cap layer 170 includes silicon (Si) with a doping concentration of approximately $5\times10^{18}\text{-}5\times10^{19}$ cm$^{-3}$.

Figure 2:
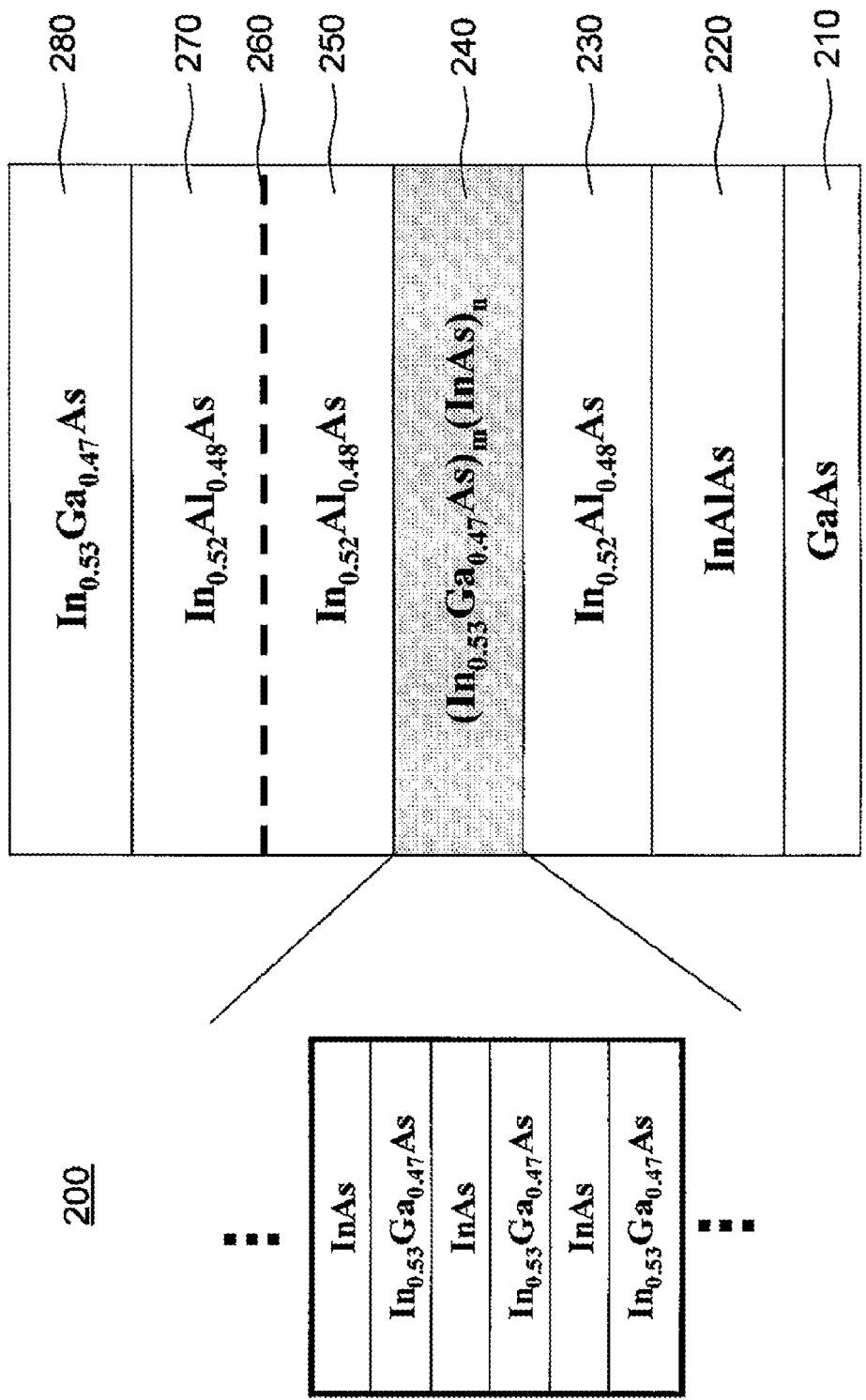
FIG. 2 is a summary diagram of a structure of a high electron mobility transistor (HEMT) according to another embodiment of the present invention.

FIG. 2 is a summary diagram of a structure of a high electron mobility transistor (HEMT) according to another embodiment of the present invention. As shown in the figure, The HEMT structure 200 includes a gallium arsenide (GaAs) substrate 210, an InAlAs metamorphic buffer layer 220, an $In_{0.52}Al_{0.48}As$ growth buffer layer 230, a channel layer 240 having a superlattice structure, an $In_{0.52}Al_{0.48}As$ spacer layer 250, a delta-doped thin film 260, an $In_{0.52}Al_{0.48}As$ schottky layer 270 and an $In_{0.53}Ga_{0.47}As$ cap layer 280.

First, the InAlAs metamorphic buffer layer 220 is formed on the GaAs substrate 210. Then, the $In_{0.52}Al_{0.48}As$ growth buffer layer 230 is formed on the InAlAs metamorphic buffer layer 220 until the InAlAs metamorphic buffer layer 220 is grown to have a certain thickness, for the channel layer 240 capable of being well formed subsequently.

Then, a plurality of $In_XGa_{1-X}As$ thin films and a plurality of InAs thin films are alternately stacked with each other on the $In_{0.52}Al_{0.48}As$ growth buffer layer 230 to form the superlattice structure used as the channel layer 240. In other words, the channel layer 240 is consisted essentially of $(InAs)_m/(In_XGa_{1-X}As)_n$, in which X has the range of approximately 0.53-0.8, and m and n represent the number of InAs thin films and $In_XGa_{1-X}As$ thin films respectively. In one embodiment, X has a range of approximately 0.53-0.6. In another embodiment, X has a range of approximately 0.6-0.7. In yet another embodiment, X has a range of approximately 0.7-0.8.

The defects or dislocations can be reduced during epitaxy process when the thickness of the epitaxy layers is smaller than a critical thickness, so using the foregoing superlattice structure having the thin films with smaller thickness to form the channel layer can reduce the disorder scattering caused by atoms in the channel layer, and thus the channel layer with high quality can be obtained to further improve the performance of the device effectively.

On the other hand, considering the characteristics of the device, the thickness of the channel layer 240 would affect the electrical characteristics, so the channel aspect ratio (W/L), i.e. gate length divided by sum of schottky layer thickness and channel layer thickness, needs to be considered in the condition of the device having a small gate length, and this value should normally be lager than 1 to avoid the short channel effect resulting in the problems that the transconductance ($g_m$) deteriorates and the RF performance deteriorates when the device is applied in the transceiver. In one embodiment, the $In_XGa_{1-X}As$ thin films alternately stacked with the InAs thin films have a total thickness of approximately 14-16 nm. In another embodiment, the $In_XGa_{1-X}As$ thin films alternately stacked with the InAs thin films have a total thickness of approximately 15 nm.

In addition, the $In_{0.52}Al_{0.48}As$ spacer layer 250 is formed on the $In_XGa_{1-X}As$ thin films alternately stacked with the InAs thin films (i.e. channel layer 240), and then the delta-doped thin film 260 is formed on the $In_{0.52}Al_{0.48}As$ spacer layer 250. In one embodiment, the delta-doped thin film 260 includes silicon (Si) with a doping concentration of approximately $3\text{-}5\times10^{12}$ cm$^{-3}$ (n-type doping). In another embodiment, the delta-doped thin film 260 includes silicon (Si) with a doping concentration of approximately $4 \times 10^{12}$ cm$^{-3}$.

The $In_{0.52}Al_{0.48}As$ schottky layer 270 is formed on the delta-doped thin film 260. The $In_{0.53}Ga_{0.47}As$ cap layer 280 is formed on the $In_{0.52}Al_{0.48}As$ schottky layer 270. Likewise, after the metal gate, drain and source electrode are fabricated on the HEMT structure 100, the gate electrode can make schottky contact with the $In_{0.52}Al_{0.48}As$ schottky layer 270, and the $In_{0.53}Ga_{0.47}As$ cap layer 280 can reduce the ohmic contact, e.g. ohmic contact between drain and source electrode. In one embodiment, the $In_{0.53}Ga_{0.47}As$ cap layer 280 includes silicon (Si) with a doping concentration of approximately $5 \times 10^{18}$-$5 \times 10^{19}$ cm$^{-3}$ (n-type doping).

Notably, the buffer layer 120, the channel layer 130, the spacer layer 140, the delta-doped thin film 150, the schottky layer 160 and the cap layer 170 shown in FIG. 1 and the InAlAs metamorphic buffer layer 220, the $In_{0.52}Al_{0.48}As$ growth buffer layer 230, the channel layer 240 having the superlattice structure, the $In_{0.52}Al_{0.48}As$ spacer layer 250, the delta-doped thin film 260, the $In_{0.52}Al_{0.48}As$ schottky layer 270 and the $In_{0.53}Ga_{0.47}As$ cap layer 280 shown in to FIG. 2 all can be formed by molecular beam epitaxy (MBE) growth process.

Moreover, for the present embodiment, the thickness of the $In_{0.52}Al_{0.48}As$ growth buffer layer 230 is approximately 100 nm, the alternately stacked $In_xGa_{1-x}As$ thin film and the InAs thin film can have 10 repeating periods (i.e. 10 $In_xGa_{1-x}As$ thin films alternately stacked with 10 InAs thin films) such that the thickness of the channel layer 240 is approximately 15 nm, the thickness of the $In_{0.52}Al_{0.48}As$ spacer layer 250 is approximately 3-8 nm, the thickness of the $In_{0.52}Al_{0.48}As$ schottky layer 270 is approximately 15-30 nm, and the thickness of the $In_{0.53}Ga_{0.47}As$ cap layer 280 is approximately 20-35 nm.

The following Table I is a comparison table of characteristics of III-V semiconductor and silicon.

As shown in Table I, since the $In_{0.53}Ga_{0.47}As$ thin films are alternately stacked with the InAs thin films in one embodiment of the present invention, the channel layer in the embodiment of the present invention has higher In content than that in the prior art, such that the effective mass of the electrons in the device is sufficiently small and the electron mobility is increased, and the direct-current characteristics and high-frequency characteristics of the device are better.

Furthermore, in the superlattice structure of the embodiments of the present invention the lattice constant of $In_{0.53}Ga_{0.47}As$ is 5.83 angstrom (Å) and the lattice constant of InAs is 6.06 angstrom (Å) in which the difference of the two lattice constants is smaller than the prior art, so it is easier to be formed by epitaxy growth (e.g. molecular beam epitaxy, MBE).

On the contrary, when the superlattice structure is formed with $InSb/InAs_yP_{1-y}$, the energy bandgap of InSb is only 0.18 eV although it has the highest electron mobility at present, so the appearance of impact ionization may occur more easily, and it is not easy to perform epitaxy due to a large lattice constant difference between these two materials according to the lattice constant table. On the other hand, if InGaAs/AlGaAs is used, one additional gas source (i.e. Al) must be used during the epitaxy process. Thus, alternately stacking the $In_{0.53}Ga_{0.47}As$ thin films with the InAs thin films to form the channel layer in one embodiment of the present invention not only effectively raises the electron mobility but also makes the structure of the channel layer simple for convenient epitaxy.

Figure 3:
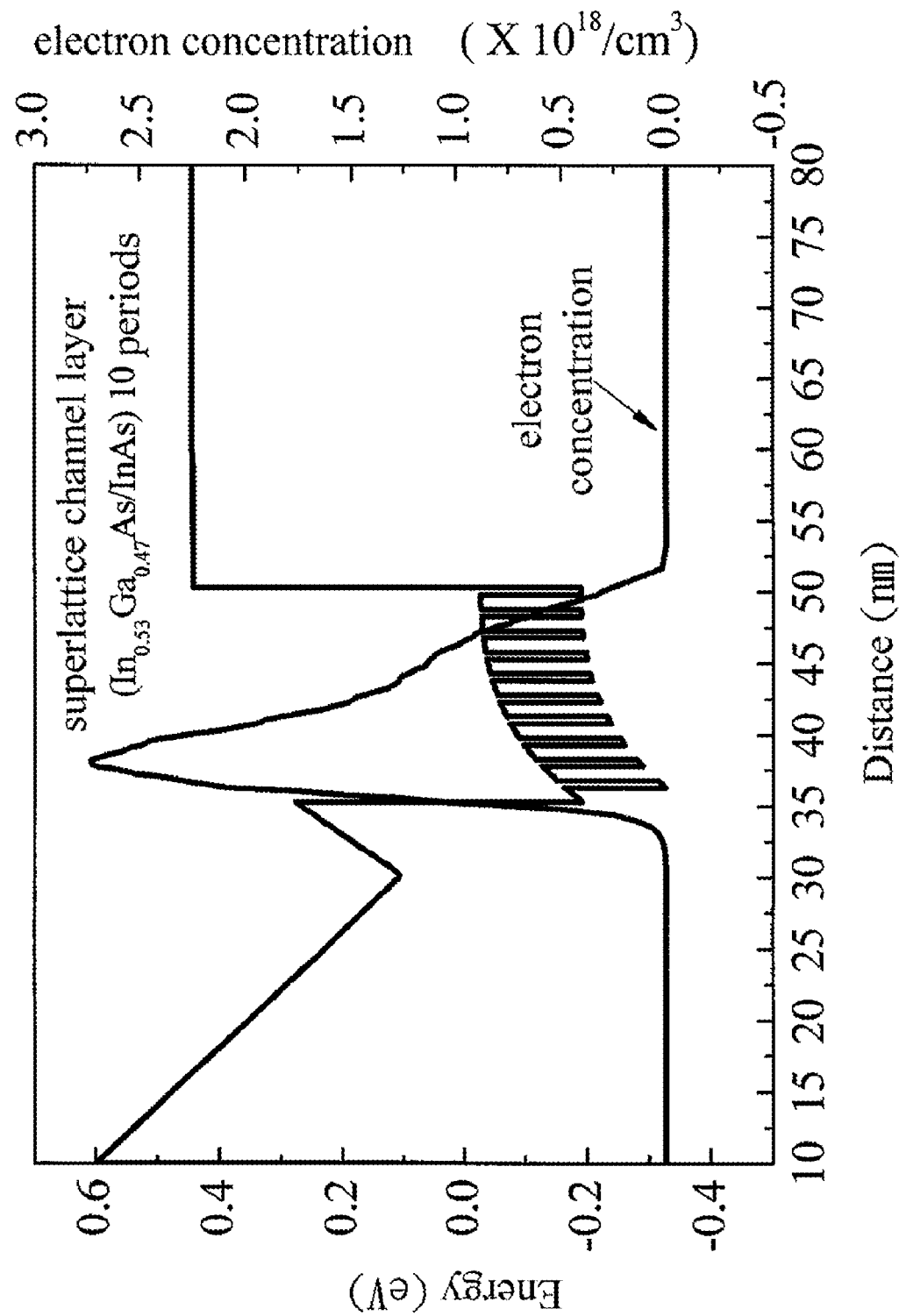
FIG. 3 is a simulation diagram of electron concentration and energy bandgap of the high electron mobility transistor structure shown in FIG. 2.

FIG. 3 is a simulation diagram of electron concentration and energy bandgap of the high electron mobility transistor structure shown in FIG. 2. As shown in the figure, under the condition that the alternately stacked $In_{0.53}Ga_{0.47}As$ thin film and the InAs thin film have 10 repeating periods so that its total thickness is approximately 15 nm (from 35 to 50 nm as shown in the figure), the electrons can thus be effectively confined in the channel layer 240 such that the electron concentration in the channel layer 240 increases significantly. In addition, the device fabricated by using the foregoing HEMT structure has a sheet charge density of approximately $2.35 \times 10^{12}$/cm$^2$ according to the simulation result.

Figure 4:
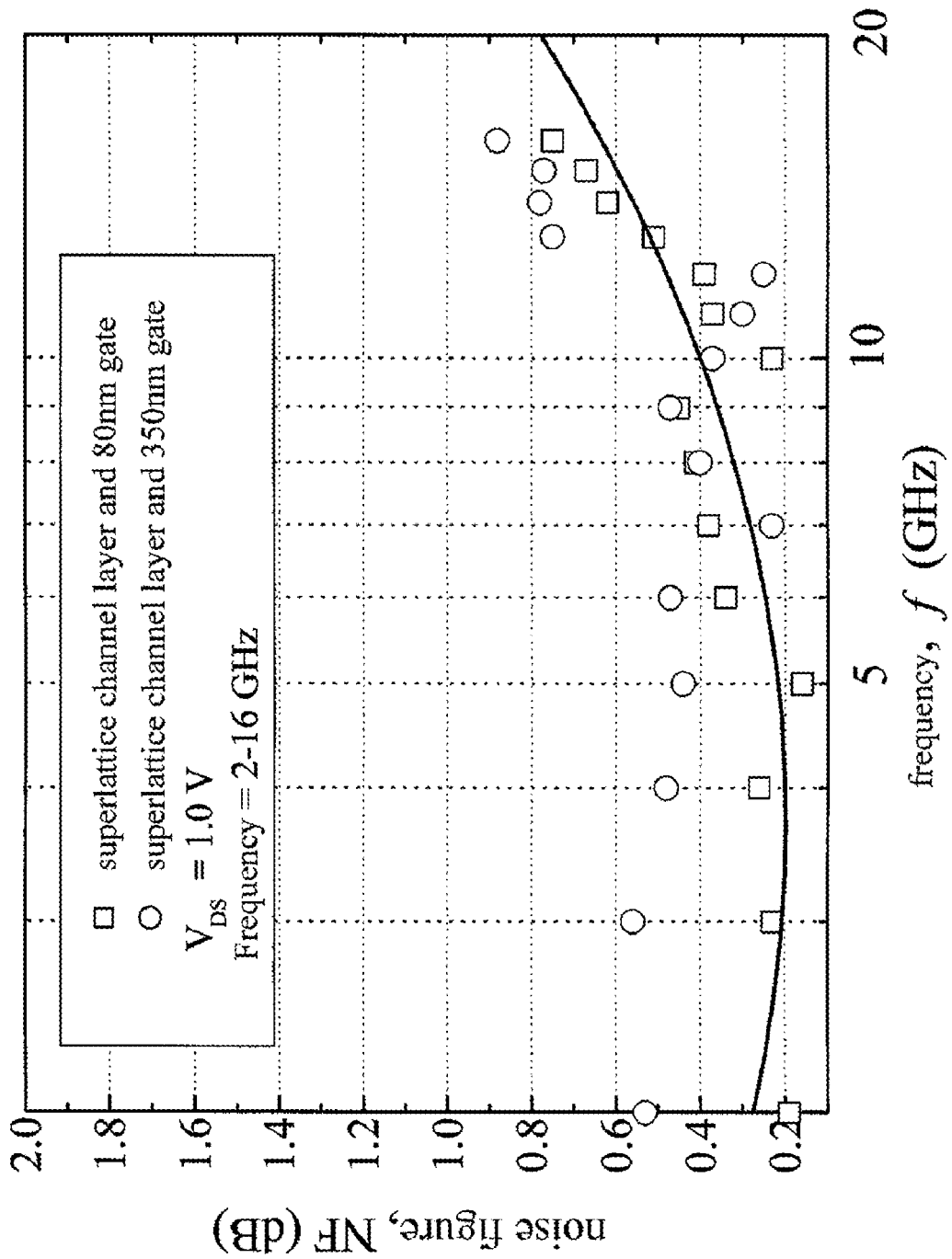
FIG. 4 is a comparison diagram of noise figures (NF) of devices having different gate sizes and HEMT structure shown in FIG. 2.

FIG. 4 is a comparison diagram of noise figures (NF) of devices having different gate sizes and HEMT structure shown in FIG. 2. As shown in the figure, under the condition that the devices having 80 nm and 350 nm gate electrode both have the same superlattice channel layer as shown in FIG. 2, their noise figures corresponded by their operating frequency 2-16 GHz are very close when the bias voltage $V_{DS}$ is 1.0V. As a result, even if the electron-beam lithography system is not used to fabricate the device with a smaller gate length (Lg) and instead the optical lithography stepper (usually for Lg$\leq$0.35 μm) is used to define a larger gate length, the pro-

TABLE I

| | Si | GaAs | $In_{0.53}Ga_{0.47}As$ | InAs | InSb | unit |
|---|---|---|---|---|---|---|
| energy bandgap | 1.12 | 1.43 | 0.75 | 0.356 | 0.175 | eV |
| electron effective mass | 0.19 | 0.072 | 0.041 | 0.027 | 0.013 | |
| electron mobility in pure material | 1,500 | 8,500 | 14,000 | 30,000 | 78,000 | cm$^2$ V$^{-1}$ s$^{-1}$ |
| electron mobility with concentration of $1 \times 10^{12}$ cm$^{-2}$ | 600 | 4,600 | 7,800 | 20,000 | 30,000 | cm$^2$ V$^{-1}$ s$^{-1}$ |
| electron drift saturation velocity | $1.0 \times 10^7$ | $1.2 \times 10^7$ | $8 \times 10^6$ | $3 \times 10^7$ | $5 \times 10^7$ | cm s$^{-1}$ |
| electron mean free path | 28 | 80 | 106 | 194 | 226 | nm |
| intrinsic carrier concentration | $1.6 \times 10^{10}$ | $1.1 \times 10^7$ | $5 \times 10^{11}$ | $1.3 \times 10^{15}$ | $1.9 \times 10^{16}$ | cm$^{-3}$ | duction of the device can still be raised and the production costs can be reduced without losing good high-frequency characteristics.

Figure 5:
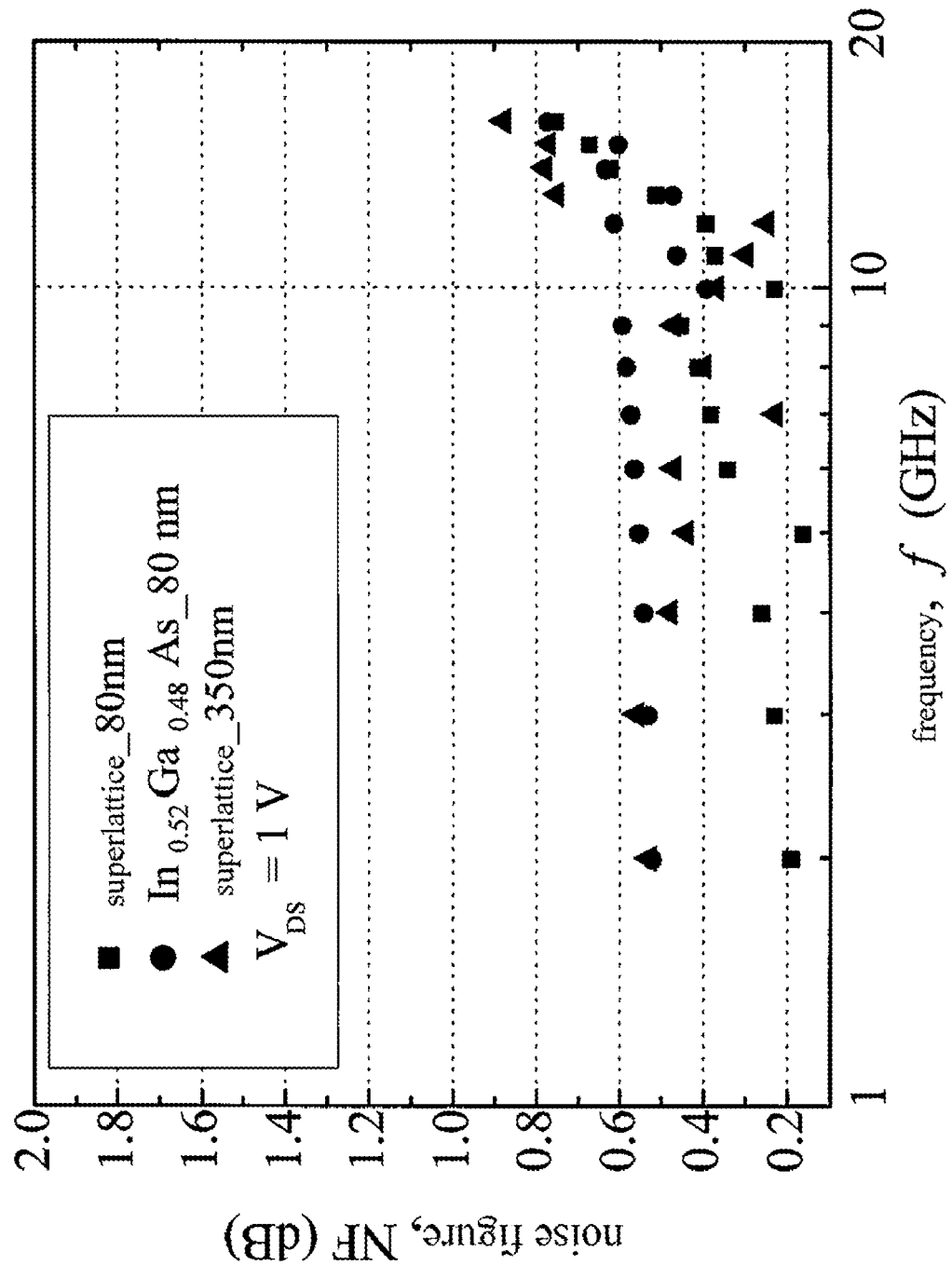
FIG. 5 is a comparison diagram of minimum noise figures (NF) of HEMT having superlattice channel shown in FIG. 2 with different gate lengths and HEMT having InGaAs channel in prior art.

FIG. 5 is a comparison diagram of minimum noise figures (NF) of HEMT having superlattice channel shown in FIG. 2 with different gate lengths and HEMT having InGaAs channel in prior art. As shown in the figure, with the same frequency 16 GHz, the HEMT having superlattice channel with gate length of 80 nm has a noise figure of 0.75 dB, the HEMT having $In_{0.52}Ga_{0.48}As$ channel with gate length of 80 nm has a noise figure of 0.77 dB, and the HEMT having superlattice channel with gate length of 350 nm has a noise figure of 0.88 dB. Thus it can be seen that the HEMT fabricated by using the superlattice channel layer in embodiments of the present invention still has good electrical performance even if it has a gate length of 350 nm.

Figure 6:
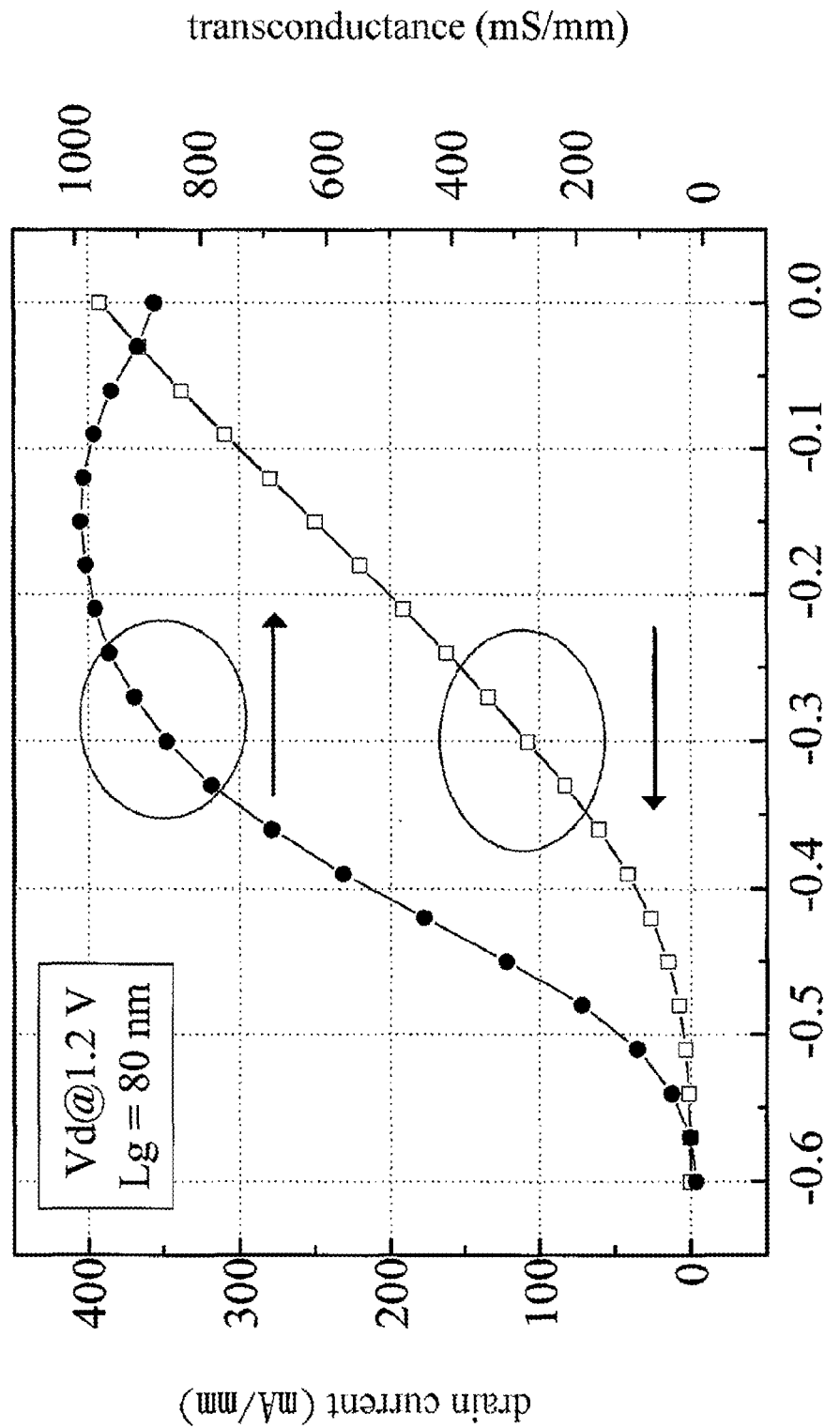
FIG. 6 is a diagram of drain current and transconductance both corresponding to different gate-source voltages of the devices using the HEMT structure shown in FIG. 2.

FIG. 6 is a diagram of drain current and transconductance both corresponding to different gate-source voltages of the devices using the HEMT structure shown in FIG. 2. As shown in the figure, the HEMT with gate length of 80 nm (Lg=80 nm) has a drain saturation current density of 392 mA/mm and a maximum transconductance of 991 mS/mm when the drain voltage is 1.2 V (Vd=1.2 V). Thus it can be seen that the direct-current characteristics of the device has been improved.

Figure 7:
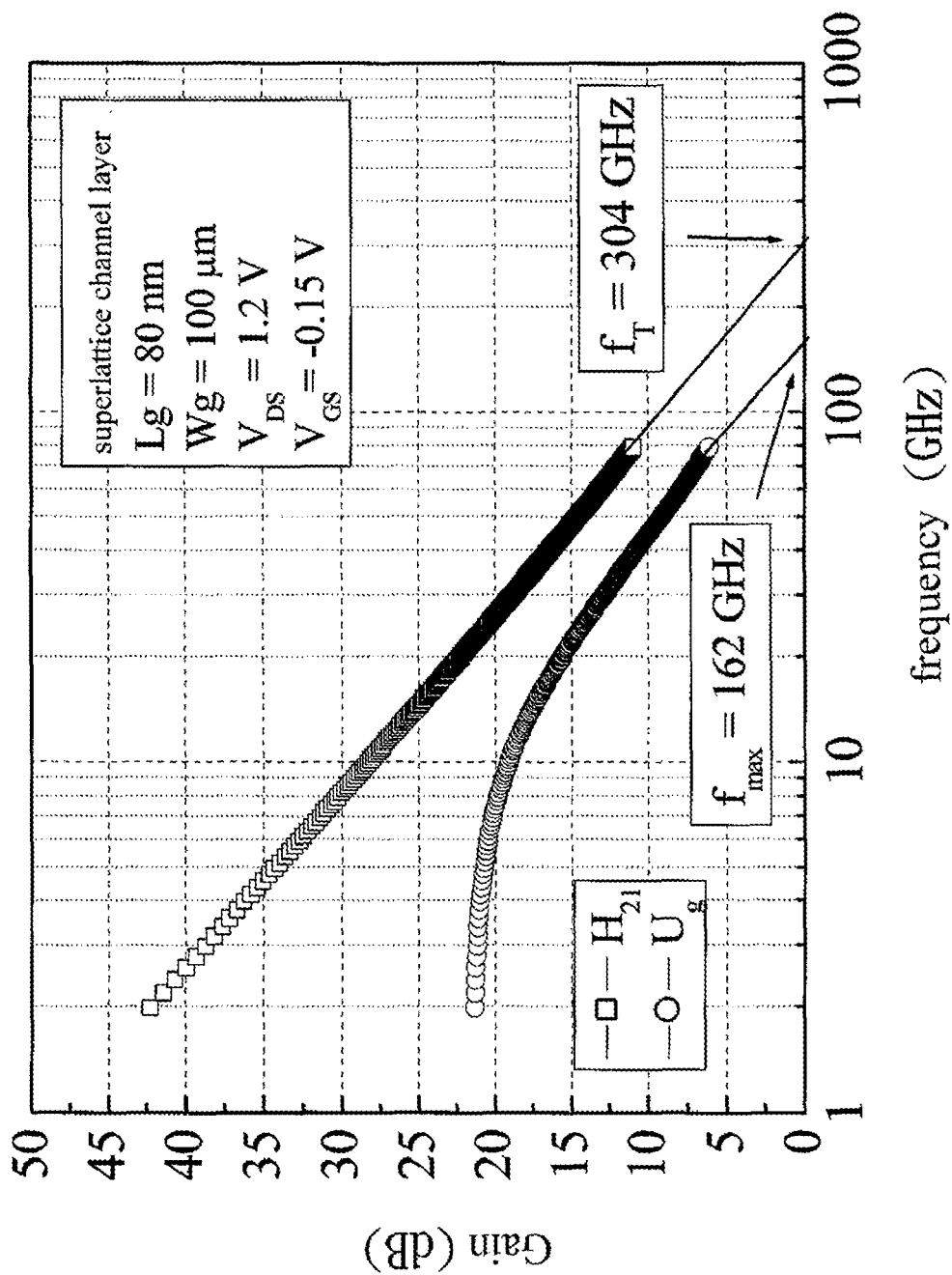
FIG. 7 is a diagram of RF characteristics of the device using the HEMT structure shown in FIG. 2 and having gate length of 80 nm after the parasitic effect is removed.

FIG. 7 is a diagram of RF characteristics of the device using the HEMT structure shown in FIG. 2 and having gate length of 80 nm after the parasitic effect is removed. As shown in the figure, with the bias voltage of 1.2 V, the current gain cut-off frequency ($f_T$) is approximately 304 GHz and the maximum oscillation frequency ($f_{max}$) is approximately 162 GHz.

As known in the results of the measured direct-current and high-frequency characteristics of the devices mentioned above, the devices using the HEMT structure shown in FIG. 2 can be applied not only in, for example, low-noise amplifier monolithic microwave integrated circuits (LNA MMIC) but also to solve the problems that in the past the production is limited due to gate size defined by the electron-beam lithography.

For the foregoing embodiments, the high electron mobility transistor (HEMT) and the method for fabricating the same can be applied not only to improve the high-frequency characteristics of the transistor (e.g. high current gain cut-off frequency, low noise figure), but also to be helpful for freeing the nanometer-scaled gate length of the high electron mobility transistor from having to be fabricated by using the electron-beam lithography system when persons skilled in the art develop the transistor with high efficacy, such that the gate electrode can be defined by the optical lithography stepper so as to raise the yield rate.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded with the broadest interpretation so as to encompass all such modifications and similar structures.

What is claimed is:

1. A high electron mobility transistor, comprising:
a substrate;
a buffer layer formed on the substrate;
a channel layer formed on the buffer layer, wherein the channel layer comprises a superlattice structure formed with a plurality of indium gallium arsenide thin films alternately stacked with a plurality of indium arsenide thin films;
a spacer layer formed on the channel layer;
a schottky layer formed on the spacer layer; and
a cap layer formed on the schottky layer.

2. The high electron mobility transistor as claimed in claim 1, wherein a material of each of the indium gallium arsenide thin films is $In_XGa_{1-X}As$, and X has a range of 0.53-0.8.

3. The high electron mobility transistor as claimed in claim 2, wherein a thickness of the superlattice structure is approximately 10-20 nm.

4. The high electron mobility transistor as claimed in claim 2, wherein a material of the buffer layer is $In_{0.52}Al_{0.48}As$.

5. The high electron mobility transistor as claimed in claim 4, wherein a material of the spacer layer is $In_{0.52}Al_{0.48}As$.

6. The high electron mobility transistor as claimed in claim 5, further comprising:
a delta-doped thin film formed between the spacer layer and the schottky layer and comprising silicon with a doping concentration of approximately $3-5 \times 10^{12}$ cm$^{-3}$.

7. The high electron mobility transistor as claimed in claim 6, wherein a material of the schottky layer is $In_{0.52}Al_{0.48}As$.

8. The high electron mobility transistor as claimed in claim 7, wherein a material of the cap layer is $In_{0.53}Ga_{0.47}As$ and the cap layer comprises silicon with a doping concentration of approximately $5 \times 10^{18}$-$5 \times 10^{19}$ cm$^{-3}$.

9. The high electron mobility transistor as claimed in claim 8, wherein a material of the substrate is gallium arsenide.

10. A method for fabricating a high electron mobility transistor, comprising:
forming a metamorphic buffer layer on a substrate;
forming a growth buffer layer on the metamorphic buffer layer;
alternately stacking a plurality of indium gallium arsenide thin films with a plurality of indium arsenide thin films on the growth buffer layer, wherein the indium gallium arsenide thin films alternately stacked with the indium arsenide thin films are formed as a channel layer;
forming a spacer layer on the channel layer;
forming a delta-doped thin film on the spacer layer;
forming a schottky layer on the delta-doped thin film; and
forming a cap layer on the schottky layer.

11. The method as claimed in claim 10, wherein a material of each of the indium gallium arsenide thin films is $In_XGa_{1-X}As$, and X has a range of 0.53-0.8.

12. The method as claimed in claim 11, wherein the indium gallium arsenide thin films alternately stacked with the indium arsenide thin films have a total thickness of approximately 12-18 nm.

13. The method as claimed in claim 11, wherein a material of the metamorphic buffer layer is InAlAs, a material of the growth buffer layer is $In_{0.52}Al_{0.48}As$.

14. The method as claimed in claim 13, wherein a material of the substrate is gallium arsenide.

15. The method as claimed in claim 11, wherein materials of the spacer layer, the delta-doped thin film and the schottky layer are $In_{0.52}Al_{0.48}As$, and the delta-doped thin film comprises silicon with a doping concentration of approximately $3-5 \times 10^{12}$ cm$^{-3}$.

16. The method as claimed in claim 15, wherein a material of the cap layer is $In_{0.53}Ga_{0.47}As$ and silicon with a doping concentration of approximately $5 \times 10^{18}$-$5 \times 10^{19}$ cm$^{-3}$.

17. A high electron mobility transistor, comprising:
a gallium arsenide substrate;
an InAlAs metamorphic buffer layer formed on the gallium arsenide substrate;
an $In_{0.52}Al_{0.48}As$ growth buffer layer formed on the InAlAs metamorphic buffer layer;

a plurality of $In_xGa_{1-x}As$ thin films and a plurality of InAs thin films alternately stacked with each other on the $In_{0.52}Al_{0.48}As$ growth buffer layer, wherein X has a range of 0.53-0.8, and the $In_xGa_{1-x}As$ thin films alternately stacked with the InAs thin films have a total thickness of approximately 14-16 nm;

an $In_{0.52}Al_{0.48}As$ spacer layer formed on the $In_xGa_{1-x}As$ thin films alternately stacked with the InAs thin films;

an $In_{0.52}Al_{0.48}As$ schottky layer formed on the $In_{0.52}Al_{0.48}As$ spacer layer; and an $In_{0.53}Ga_{0.47}As$ cap layer formed on the $In_{0.52}Al_{0.48}As$ schottky layer.

18. The high electron mobility transistor as claimed in claim 17, further comprising:

a delta-doped thin film formed between the $In_{0.52}Al_{0.48}As$ spacer layer and the $In_{0.52}Al_{0.48}As$ schottky layer and comprising silicon with a doping concentration of approximately $3\text{-}5\times10^{12}$ cm$^{-3}$.

19. The high electron mobility transistor as claimed in claim 17, wherein the $In_{0.53}Ga_{0.47}As$ cap layer comprises silicon with a doping concentration of approximately $5\times10^{18}\text{-}5\times10^{19}$ cm$^{-3}$.

20. The high electron mobility transistor as claimed in claim 17, wherein the InAlAs metamorphic buffer layer, $In_{0.52}Al_{0.48}As$ growth buffer layer, the $In_xGa_{1-x}As$ thin films alternately stacked with the InAs thin films, the $In_{0.52}Al_{0.48}As$ spacer layer, the $In_{0.52}Al_{0.48}As$ schottky layer, and the $In_{0.53}Ga_{0.47}As$ cap layer are all formed by molecular beam epitaxy growth.

* * * * *